United States Patent
Dauplaise et al.

(10) Patent No.: US 6,380,097 B1
(45) Date of Patent: Apr. 30, 2002

(54) METHOD FOR OBTAINING A SULFUR-PASSIVATED SEMICONDUCTOR SURFACE

(75) Inventors: Helen M. Dauplaise, Brockton; Andrew Davis, Boston; Kenneth Vaccaro, Acton; Joseph P. Lorenzo, Stow, all of MA (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 09/075,553

(22) Filed: May 11, 1998

(51) Int. Cl.$^7$ .................................. H01L 21/3063
(52) U.S. Cl. ................. 438/745; 438/750; 438/753; 438/754
(58) Field of Search .................... 438/745, 750, 438/751, 152; 257/199, 100, 67

(56) References Cited

U.S. PATENT DOCUMENTS 5,689,125 A * 11/1997 Vaccaro et al. ............. 257/200
5,716,535 A * 2/1998 Lee et al. .................... 216/99

OTHER PUBLICATIONS

Daniel Lincot and Raul Borges, Epitaxial growth of Cds on InP from aqueous ammonia solution, Appl Phys. Letter 64(5), 1994, pp–569.*
George Ramseyer and Helen Dauplais, Analysis of thin CdS layers for improved MIS device, J. Appl Phys 8095), 1996, pp. 2873–2882.*
Kenneth Vaccaro and Helen Dauplais, Indium phosphide passivation using thin layers of Cds, Appl. Phys. Letter 67(4), 1995, pp. 527–529.*

* cited by examiner

Primary Examiner—Benjamin L. Utech
Assistant Examiner—Lan Vinh
(74) Attorney, Agent, or Firm—Robert L. Nathans

(57) ABSTRACT

An aqueous thiourea-ammonia treatment is used to form a thin sulfurous film at the indium phosphide surface, having a thickness of less than one nanometer. The thiourea-ammonium hydroxide treatment can be used as is or immediately prior to deposition of cadmium sulfide for enhanced surface passivation. The thiourea-ammonium hydroxide treatment is entirely compatible with chemical bath deposition, molecular beam epitaxy, or metalorganic chemical vapor deposition of the cadmium sulfide.

17 Claims, 3 Drawing Sheets

METHOD FOR OBTAINING A SULFUR-PASSIVATED SEMICONDUCTOR SURFACE

STATEMENT OF GOVERNMENT INTEREST

The invention described herein may be manufactured and used by or for the Government for governmental purposes without the payment of any royalty thereon.

BACKGROUND OF THE INVENTION

The present invention relates to the field of electronic semiconductor device technology.

The III-V semiconductor indium phosphide (InP) is recognized as a superior material for high frequency optoelectronic circuits. Although high quality epitaxial material is commercially available, the challenge of forming well-behaved interfaces between the epitaxial semiconductor and insulators or metals remains formidable. Upon heating to normal processing temperatures, InP is susceptible to dissociation, that is, separation into its elemental constituents, indium and phosphorus. Since phosphorus is more volatile than indium, it vaporizes, leaving behind an indium-rich near-surface. Like silicon, indium oxidizes readily in air. Unlike silicon, oxidized indium is electrically conductive, with a large defect density. An InP surface in this condition, whether it has been subjected to thermal processing or not, has proven to be of poor electrical quality, with a high density of interface states. Other III-V semiconductors have analogous problems. Any devices subsequently fabricated on such a substrate will demonstrate unacceptable performance degradation, which can manifest itself as leakage between devices, failure to switch on or off, or suppressed gain. This includes devices that rely on the InP substrate for isolation. Hence we cannot afford interdevice leakage. It also includes metal-insulator-semiconductor (MIS) devices fabricated with a deposited insulator, such as silicon dioxide or silicon nitride, as an integral part of the device. These devices require a nearly perfect semiconductor/insulator interface for optimum performance. Should an insulator be deposited on a highly defective InP surface, the performance of the subsequently fabricated device is certain to be unacceptable.

It has been demonstrated in numerous publications that sulfur is an excellent passivating agent for the InP surface. Sulfur tends to fill phosphorus vacancies and ameliorate the problems usually associated with an indium-rich InP surface. Additionally, an indium sulfide (InS) layer serves as a protective film that prevents re-formation of the InP native oxides. Most known sulfur passivation techniques, such as treatment in ammonium sulfide or sodium sulfide, polysulfide immersion, or elemental sulfur deposition are messy, cumbersome, or both. Potassium hydroxide, a strong base, has long been used to aid in the removal of native oxides from InP. The high concentration of ammonium hydroxide, a weak base, in our treatment solution acts similarly. We have developed a thiourea-ammonium hydroxide treatment process that removes native oxides and leaves a sulfurous film on the semiconductor surface.

BRIEF SUMMARY OF THE INVENTION

In accordance with a presently preferred method of carrying out the invention, an indium phosphide, or other group III-V semiconductor layer is exposed to an aqueous ammonia-thiourea solution at 65–95 degrees C. to produce a layer of InS thereon having a thickness of about one nanometer or less to passivate the exposed layer. Optionally, the resulting layer can thereafter be beneficially exposed to a cadmium ion solution to create a CdS layer over the InP layer.

The thiourea-ammonium hydroxide treatment of the present invention is completely compatible with the CdS chemical bath deposition described in our U.S. Pat. No. 5,689,125, issued Nov. 18, 1997 to Vaccaro et al., which can be used to grow a CdS film on the surface of InP or many of its related III-V semiconductors. Furthermore, it is fully compatible with any other subsequent deposition technique, such as molecular beam epitaxy, as well as almost any standard semiconductor device processing sequence. Out thiourea-ammonium hydroxide treatment, prior to an optional CdS deposition, yields even better electrical response in metal-insulator-semiconductor (MIS) devices than just CdS deposition.

The various features of the invention will become more apparent upon study of the following detailed description, taken in conjunction with the drawings.

DETAILED DESCRIPTION OF EMBODIMENTS OF THE INVENTION

Figure 1:
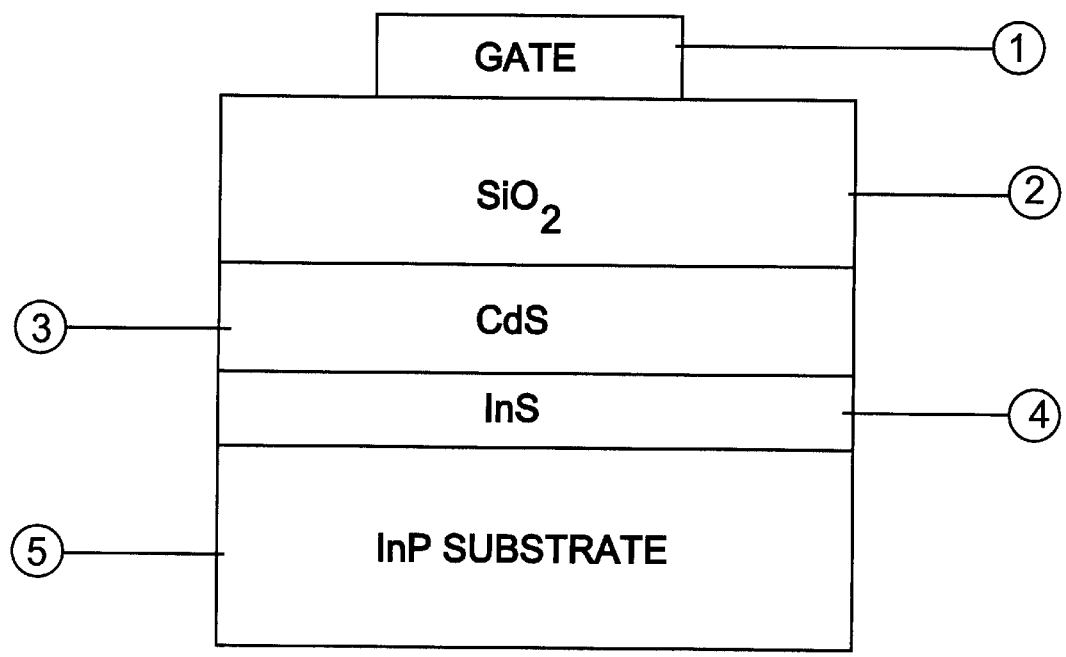
FIG. 1 diagrammatically illustrates an exemplary MIS structure that has been given the thiourea-ammonium hydroxide treatment of the present invention.

Referring now to FIG. 1, we form a thin layer 4 of indium sulfide at the InP surface 5 by treating the semiconductor in a solution of ammonium hydroxide and thiourea. The ammonium hydroxide quickly deoxidizes the InP surface 5 and released the sulfur present in the thiourea, which then bonds to indium at the InP surface 5, forming an InS layer 4. The sulfurous layer 4 makes the III-V InP surface 5 more amenable to the required processing environment. Should subsequent CdS deposition be desired, CdS layer 3 can be readily deposited on the sulfurous InS layer 4, regardless of deposition technique. The benefits previously described have been achieved by depositing one nanometer or less of a sulfur-rich layer 4 at the InP surface 5. This layer appears to be InS, as demonstrated in our publication, "Analysis of InP Passivated with Thiourea/Ammonia Solutions and Thin CdS Films," in Volume 448 of the Materials Research Society Symposium Proceedings, Control of Semiconductor Surfaces and Interfaces, pp. 69–74, September 1997. We also show that the resulting InS film is stable up to 400° C., a major improvement in InP processing technology. The InS layer 4 is preferably produced by treating InP substrates in a thiourea-ammonium hydroxide solution at 65–95° C. The thiourea-ammonium hydroxide treatment is simple, controllable, and entirely compatible with the cadmium sulfide surface passivation technique described in our U.S. Pat. No. 5,689,125.

Upon exposure to air, InP develops a complex set of surface oxides, including $In_2O_3$, $P_2O_5$, and $InPO_x$, where x varies with ambient conditions. Other III-V semiconductors behave analogously. These surface oxides present considerable challenges to fabricating devices on the semiconductor surface between they are very poor insulators and posses a high density of interface traps, which render fabricated devices leaky, feeble, and unreliable. The thiourea-ammonium hydroxide treatment forms a thin InS layer in a 12.1 M ammonia and 0.033 M thiourea solution. The ammonium hydroxide in the treatment solution quickly removes the native oxides on the InP surface, then the solution forms a protective sulfide film.

For convenience, stock solutions of ammonium hydroxide and thiourea were used in our successful passivation process. The ammonium hydroxide, assumed to be 14.5 M ammonia, is undiluted from the manufacturer's bottle. The thiourea stock solution is 0.2 M, mixed from 99+ % pure powder and stored in an amber bottle. We typically use 14.4 ml of ammonium hydroxide and 2.8 ml of 0.2 M thiourea stock solution, which yields 17.2 ml of 12.1 M ammonia and 0.033 M thiourea. The total quantity of solution can be varied as needed. The thiourea is added to the ammonium hydroxide in the deposition beaker, which is gently swirled by hand to mix the solution. Samples for MIS test capacitors are generally taken straight from the wafer manufacturer's box to the deposition solution to minimize contamination. Typical sample sizes range from 0.5 to 10 square centimeters. Devices that have already undergone some processing steps are typically stripped of all photoresist and oxidized with ozone. These samples are then etched in hydrofluoric acid and rinsed in deionized water before the thiourea-ammonium hydroxide treatment. The samples are placed face-up in a glass beaker of the room temperature solution. More than one sample can be placed in the deposition beaker, if desired. The beaker is suspended in a water bath at 65–95° C., which improves temperature stability. The deposition temperature does not appear to be critical. No stirring is performed during deposition. The ammonium hydroxide released the sulfur from the thiourea, allowing the sulfur to bond with the indium on the InP surface 5. The following equation describes what happens in the heated solution:

where $CS(NH_2)_2$ is thiourea. After fifteen minutes the sample is pulled from the treatment solution and thoroughly rinsed in deionized water and dried. It is now ready for further processing. If chemical bath deposition of CdS is to be the next step, then instead of rinsing the sample with water, it can be placed directly into a fresh thiourea-ammonium hydroxide solution. Cadmium sulfate or cadmium acetate can then be added to this solution to create a CdS chemical bath deposition solution. For any vacuum deposition technique, the sample is carried to the system in air—the sulfurous layer 4 protects the semiconductor surface from re-oxidation. Subsequent deposition of an insulator such as silicon dioxide layer 2 and gate metal portion 1, yield a structure like that shown in FIG. 1. This capacitance-voltage response of this structure is an excellent test of the electrical and, to a lesser degree, physical quality of the interface region between the substrate and the insulator.

Figure 2:
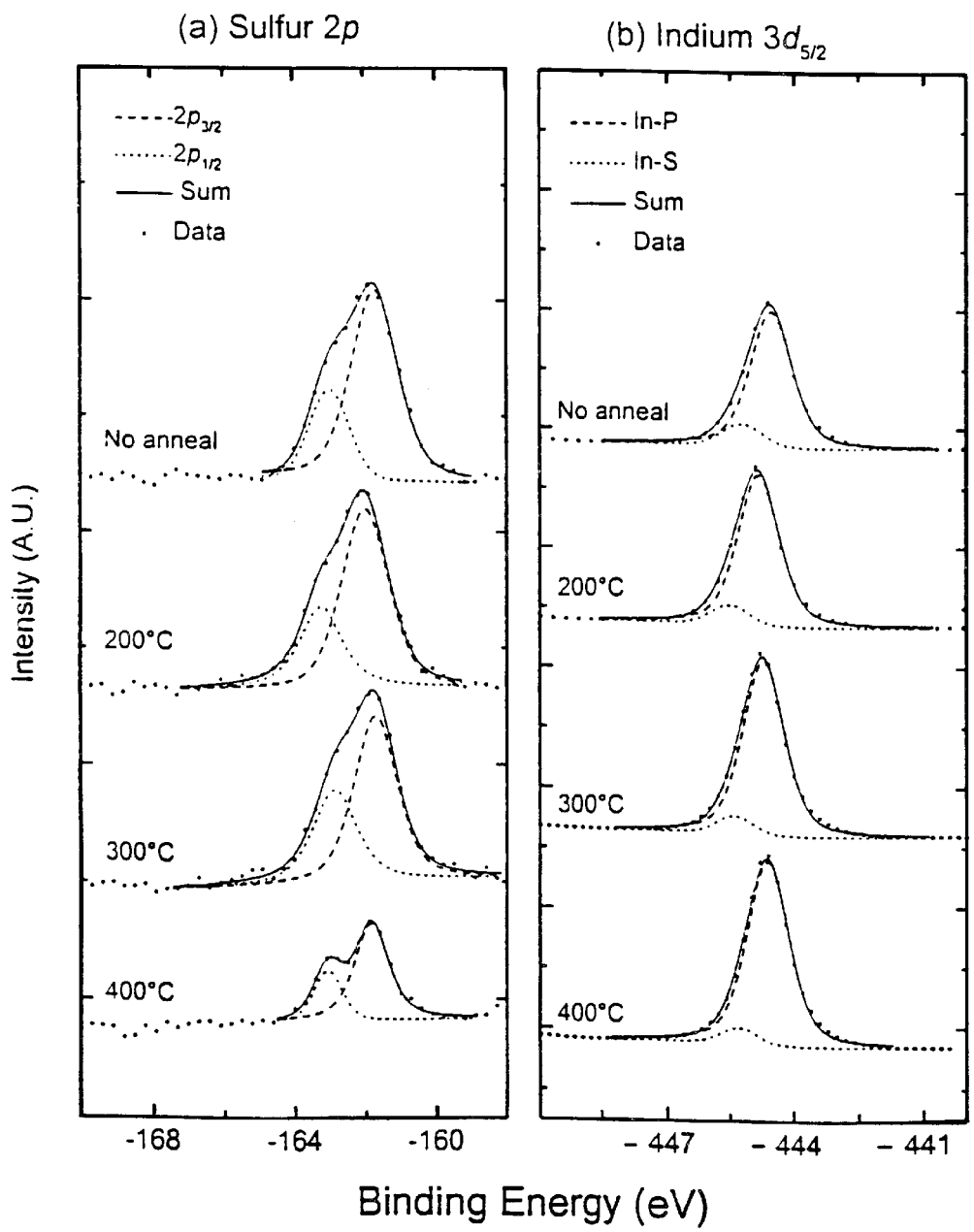
FIG. 2 graphically shows the (a) sulfur 2p and (b) indium $3d_{5/2}$ x-ray photoelectron spectroscopy (XPS) scans of a thiourea-ammonium hydroxide-treated InP sample after various stages of annealing. For each scan, the figures include the measured data, the two resolved peaks, and the sum of the resolved peaks.

X-ray photoelectron spectroscopy is used to detect which chemical elements are present at a sample's near-surface and to which elements they are chemically bound. Note in FIG. 2(a) that a considerable fraction of the sulfur initially present after the thiourea-ammonium hydroxide treatment remains, even after heating to 400° C. The binding energy of the sulfur peak is where one would expect to find if for a sulfide. Sulfur comprises 5.8% of the total detected signal on the unannealed sample; it is reduced to 3.3% following annealing at 400° C. No sulfur oxides (167–169 eV) are observed, even following heating to 400° C. The presence of a sulfur signal after the 400° C. anneal indicates the remaining sulfur is strongly bonded to the substrate and stable beyond the temperature required for most InP processing. FIG. 2(b) indicates that the indium peak gets stronger after annealing. This is because the loss of some of the surface sulfur allows the x-rays to penetrate more deeply into the substrate. Note that a constant In-S peak remains throughout the anneal cycle, confirming the presence of In-S bonding.

Figure 3:
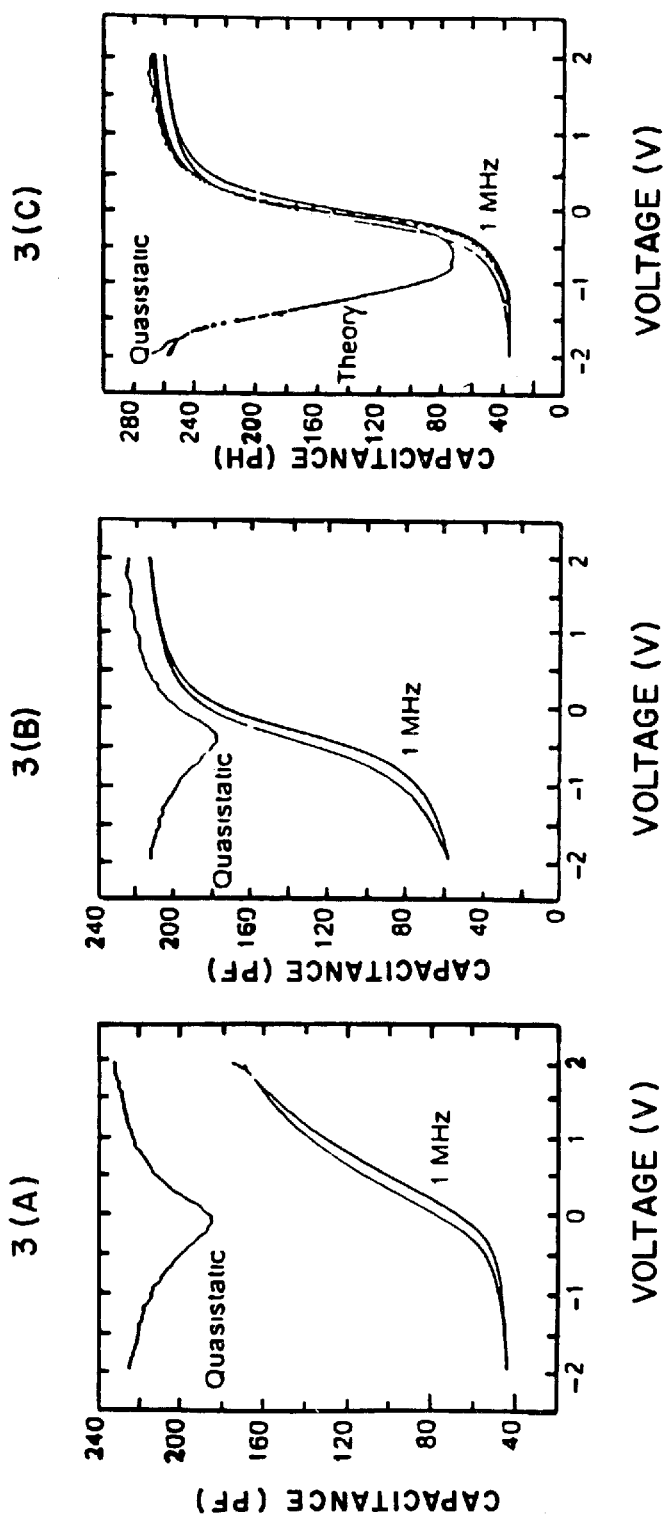
FIG. 3 graphically shows the quasistatic and 1 Megahertz capacitance-voltage response of (a) an untreated InP MIS structure; (b) an MIS structure fabricated on InP treated with thiourea-ammonium hydroxide; and (c) an MIS structure fabricated on InP treated with thiourea-ammonium hydroxide followed by chemical bath deposition of CdS.

The deposition of CdS from an aqueous solution of thiourea, ammonium hydroxide, and cadmium sulfate, is described in our U.S. Pat. No. 5,689,125. It should be clear that the thiourea-ammonium hydroxide treatment is very much compatible with the CdS chemical bath deposition process. However, an advantage of the thiourea-ammonium hydroxide treatment is that it is compatible with any other subsequent deposition process, including molecular beam epitaxy. This sulfurous layer-CdS system has been shown to yield more consistent and higher quality metal-insulator-semiconductor devices on InP than a CdS film along acting as an interlayer between InP and $SiO_2$. FIG. 3 compares the C-V response of three different MIS systems. The InP that has received only hydrofluoric acid etching prior to insulator deposition demonstrates poor C-V response. The thiourea-ammonium hydroxide-treated sample yields considerably better C-V response, and the sample with thiourea-ammonium hydroxide treatment prior to CdS deposition yields nearly ideal C-V response. Although C-V response is an important criterion for judging the effectiveness of surface treatments, it is not the only one. For example, it gives no indication of the effectiveness of the thiourea-ammonium hydroxide treatment in isolating devices that had been suffering from interdevice leakage.

It should now be understood that the thiourea-ammonium hydroxide treatment of the invention is simple and readily integrable into current InP-based processing technologies. These include processes used to make metal-semiconductor Schottky barrier devices such as HEMTs and MSM photodetectors; metal-insulator-semiconductor devices, including MISFETs; or any optoelectronic device that requires surface passivation or is susceptible to surface leakage.

While preferred methods of the invention have been described, variations will occur to the skilled worker in the art and thus the scope of the invention is to be limited solely by the terms of the following claims and art recognized equivalents thereof. As previously stated, other III-V semiconductors behave in a manner analogous to indium phosphide. For example, the following compounds in the III-V group, among others, may be employed to practice the invention in place of InP: GaAs, InGaAs, InGaP, InAlAs, InAlGaAs, InGaAsP and alloys thereof.

We claim:

1. In a method of manufacturing an electronic component having an InP layer, the improvement comprising the step of subjecting said InP layer to a solution consisting of ammonium hydroxide and thiourea at an elevated temperature to passivate the InP layer.

2. The method of claim 1 wherein said solution includes a sufficient amount of ammonium hydroxide to enable quick removal of native oxides in the InP layer and release of sulfur from the thiourea.

3. The method of claim 1 wherein said step is performed for a time period sufficient to produce a layer of InS upon said InP layer having a thickness of about one nanometer or less.

4. The method of claim 3 wherein said solution includes a sufficient amount of ammonium hydroxide to enable quick removal of native oxides in the InP layer and release of sulfur from the thiourea.

5. The method of claim 1 wherein said elevated temperature is between 65 and 95 degrees centigrade.

6. The method of claim 5 wherein said step is performed for a time period sufficient to produce a layer of InS upon said InP layer having a thickness of about one nanometer or less.

7. The method of claim 5 wherein said solution includes a sufficient amount of ammonium hydroxide to enable quick removal of native oxides in the InP layer and release of sulfur from the thiourea.

8. The method of claim 6 wherein said solution includes a sufficient amount of ammonium hydroxide to enable quick removal of native oxides in the InP layer and release of sulfur from the thiourea.

9. In a method of manufacturing an electronic component having a group III-V semiconductor layer thereon, the improvement comprising the step of subjecting said group III-V semiconductor layer to a solution consisting of thiourea and a sufficient concentration of ammonium hydroxide to passivate said III-V semiconductor layer by removing native oxides thereon and releasing sulfur from said thiourea.

10. The method of claim 9 wherein said step is performed at an elevated temperature of between 65–95 degrees centigrade.

11. The method of claim 9 wherein said III-V semiconductor layer is selected from the group consisting essentially of InP, InGaAs, InGaP, InAlAs, InAlGaAs, InGaAsP and alloys thereof.

12. The method of claim 11 wherein the step is performed for a time period sufficient to produce a layer of InS upon said III-V semiconductor layer having a thickness of about one nanometer or less.

13. The method of claim 4 wherein said step is performed for a time period sufficient to produce a layer of InS upon said III-V semiconductor layer, having a thickness of about one nanometer or less.

14. The method of claim 13 wherein said step is performed at an elevated temperature of between 65–95 degrees centigrade.

15. In a method of manufacturing an electronic component having an InP layer, the improvement comprising the step of subjecting said InP layer to a solution consisting of thiourea and a sufficient concentration of ammonium hydroxide to passivate the InP layer by removing native oxides on the InP layer and releasing sulfur from the thiourea.

16. In a method of manufacturing an electronic component having a group III-V semiconductor layer thereon, the improvement comprising the step of subjecting said group III-V semiconductor layer to a solution consisting of thiourea and a sufficient concentration of ammonium hydroxide to passivate said III-V semiconductor layer by removing native oxides thereon and releasing sulfur from said thiourea whereby a layer of InS having a thickness of about one nanometer or less is deposited upon said III-V semiconductor layer.

17. The method of claim 16 further including depositing a layer of CdS upon said layer of InS.

\* \* \* \* \*